(12) United States Patent
Ellens et al.

(10) Patent No.: US 6,799,865 B2
(45) Date of Patent: Oct. 5, 2004

(54) LED-BASED PLANAR LIGHT SOURCE

(75) Inventors: Andries Ellens, The Hague (NL); Karl-Peter Schliep, München (DE); Franz Zwaschka, Ismaning (DE)

(73) Assignee: Patent-Treuhand-Gesellschaft für Elektrische Glühlampen mbH, München (DE)

( * ) Notice: Subject to any disclaimer, the term of this patent is extended or adjusted under 35 U.S.C. 154(b) by 0 days.

(21) Appl. No.: 10/199,932

(22) Filed: Jul. 19, 2002

(65) Prior Publication Data

US 2003/0026096 A1 Feb. 6, 2003

(30) Foreign Application Priority Data

Jul. 31, 2001 (DE) .......................................... 101 37 042

(51) Int. Cl.⁷ ............................. F21V 11/00; H01J 1/62; H01J 63/04
(52) U.S. Cl. ....................... 362/240; 362/231; 362/800; 313/501; 313/504
(58) Field of Search ................................ 313/502, 503, 313/504, 512; 257/89, 98, 99, 100, 103; 362/231, 240, 293, 800

(56) References Cited

U.S. PATENT DOCUMENTS

| | | | | |
|---|---|---|---|---|
| 5,619,351 | A | | 4/1997 | Funamoto et al. |
| 5,803,579 | A | * | 9/1998 | Turnbull et al. ............ 362/516 |
| 5,813,753 | A | * | 9/1998 | Vriens et al. ............... 362/293 |
| 6,084,250 | A | * | 7/2000 | Justel et al. .................. 257/89 |
| 6,252,254 | B1 | | 6/2001 | Soules et al. |
| 6,329,676 | B1 | * | 12/2001 | Takayama et al. ............ 257/95 |

FOREIGN PATENT DOCUMENTS

| | | |
|---|---|---|
| JP | 7-176794 | 12/1993 |
| WO | WO 97/48138 | 6/1996 |
| WO | WO 00/33390 | 11/1998 |

\* cited by examiner

*Primary Examiner*—Alan Cariaso
*Assistant Examiner*—Ali Alavi
(74) *Attorney, Agent, or Firm*—Frishauf, Holtz, Goodman & Chick, P.C.

(57) ABSTRACT

The planar light source (1) uses the principle of RGB mixing, the radiation of UV diodes (5) arranged in a planar fashion being converted by means of phosphors (7) which emit in the red and green spectral regions. The blue component is added by blue-emitting LEDs (8) whose radiation is preferably launched as a lateral diode row (9).

13 Claims, 5 Drawing Sheets

LED-BASED PLANAR LIGHT SOURCE

TECHNICAL FIELD

The invention relates to an LED-based planar light source in accordance with the preamble of claim 1. In particular, this is a planar light source for LCD backlighting, or else for other applications, which is, in particular, fully colour-capable and, moreover, has a high luminance.

BACKGROUND ART

JP-A 7-176794 has already disclosed an LED-based planar light source in the case of which a blue LED produces white light on a planar surface by means of partial conversion by a yellow-orange phosphor. However, this simple complementary mixing does not permit good colour rendering.

A more complicated concept with better colour rendering is three colour mixing. In this case, the primary colours red-green-blue (RGB) are used to produce white by mixing. Use can be made here either of a blue LED for the partial conversion of two phosphors which emit red and green (WO 00/33390), or of a UV-emitting LED which excites three phosphors which respectively have their emission in the red, green and blue—see WO 97/48138. Examples are line emitters such as YOB:Ce,Tb (green) and YOS:Eu (red). However, this requires a relatively shortwave emission (UV region <370 nm) in order to be able to achieve high quantum yields. This conditions the use of sapphire substrates for the UV-LEDs which are very expensive. On the other hand, if use is made of a UV-LED based on the cheaper SiC substrates, it is necessary to accept an emission in the region of 380 to 420 nm, and this renders difficult or impossible the use of line emitters in the green and red. This leads to absorption problems in the case of blue phosphors.

A specific problem here is, moreover, the additional absorption loss of blue radiation owing to the broadband nature of the absorption of the red- and green-emitting phosphors. Taken altogether, this leads to clear restrictions in the setting of the light colour and/or the luminance efficiency.

DISCLOSURE OF THE INVENTION

It is an object of the present invention to provide a fully colour-capable planar light source utilizing the colour mixing principle, the radiation from UV-emitting diodes arranged in a planar fashion being converted into light of longer wavelength by means of conversion by at least one UV-absorbing phosphor, and this light being mixed with a blue component, which achieves a high luminance efficiency and yet is economical.

This object is achieved by means of the following features: the radiation of the UV diodes is absorbed by the at least one phosphor while the blue component is provided by at least one blue-emitting LED.

Particularly advantageous refinements are to be found in the dependent claims.

Planar light sources as described in outline in U.S. Pat. No. 5,619,351, for example, are frequently used for backlighting of LCDs. In this case, a compact fluorescent lamp has predominantly been used to date as light source. This requires a high supply voltage and creates problems with electromagnetic compatibility, for which reason it is worth attempting to replace the lamps by LEDs.

According to the invention, a planar light source which is fully colour-capable is provided by utilizing the RGB principle, the radiation of a multiplicity of UV diodes arranged in a planar fashion being converted into light of longer wavelength by means of conversion by phosphors. Here, the term UV means the region of 300 to 420 nm. The radiation of the UV diodes is absorbed solely by green-emitting phosphors (preferably with a peak emission wavelength between 510 and 560 nm, for example $SrAl_2O_4:Eu^{2+}$ or $Eu^{2+}$-based thiogallates) and red-emitting phosphors (preferably with a peak emission wavelength of more than 590 nm up to 690 nm, for example $Sr_2Si_5NB:Eu^{2+}$) while the blue component (preferably with a peak emission wavelength between 430 and 490 nm) is provided by blue-emitting LEDs. This principle is surprising per se, because at first glance it appears substantially more complicated than the known solutions, since more LEDs are used, and the latter must be driven in a fashion separated at least into two groups (UV-LEDs and blue LEDs).

However, it is to be borne in mind in this case that the price of blue LEDs is more favourable than the price of UV-LEDs, and that, on the other hand, it is possible to economize on a few UV-LEDs. Moreover, a spatial separation of the blue LEDs from the red and green phosphors provides an elegant possibility of avoiding partial absorption of the blue radiation of the LEDs by these RG phosphors. Consequently, a more efficient light source can be created at lower cost. Finally, particular advantages are associated with the fact that instead of an expensive UV-LED on a sapphire substrate with an emission peak below 380 nm it is possible to use as UV-LED a cheap GaN-based LED (preferably doped with In and/or Al) on an SiC substrate with an emission peak between 380 and 420 nm. The point is that a slight overlap between the emission spectrum of the UV-LED and an absorption spectrum of, for example, a blue-emitting phosphor plays no role at all in the concept according to the invention, while it yields poorer results in the case of the conversion of UV into blue (>380 nm). This energy spacing (overlap) between excitation source and absorption curve of the phosphor no longer plays an important role with reference to the red- or green-emitting phosphor which, in some circumstances, both use the same activator, in particular Eu. In general, it emerges that the absorption problem no longer plays a role in the case of broadband-emitting phosphors, in particular starting from approximately 490 nm peak emission. The concept of the present invention can therefore not only be applied in the case of RGB mixtures, but also includes the application of additional phosphors. A further application is, finally, the production of a white light source on the simpler principle of blue-yellow mixing, in accordance with the first white-emitting LEDs of the prior art. In this case, the blue component is provided here by the primary emission of a number of blue LEDs, and the yellow component is provided by the yellow emission of a suitable phosphor excited by a number of UV-LEDs. A further application is, moreover, the provision of a planar light source of specific colour, it being possible for this special colour to be produced by mixing a blue and a further component. In this case, the blue component is again provided by the primary emission of a number of blue LEDs, and the further components are provided by the emission of a (or else a plurality of further) suitable phosphor excited by a number of UV-LEDs, the desired colour resulting from the mixing of the emissions. Concrete examples for such phosphors have, for example, peak emissions in the blue-green (for example $Sr_6BP_5O_{20}:Eu^{2+}$, $Sr_4Al_{14}O_{25}:EU^{2+}$) or green-yellow or yellow (for example $Sr_2Si_5N_8:Ce^{3+}$, $(Sr,Ba)SiO_4:Eu^{2+}$) or yellow-orange (for example $Ca_2Si_5N_8:EU^{2+}$, $Ca_{1.5}Al_3Si_9N^{16}:Eu^{2+}$).

In principle, the RG phosphors can be placed directly on the individual UV-LEDs. It is advantageous for the red- and green-emitting phosphors to be applied to, or implemented inside, on an optical conductor fitted at a spacing from the UV diodes, or on a transparent plate acting like an optical conductor, because the spacing yields a better uniformity of the planar emission. The number of the blue-emitting LEDs per assembly is at most equal to the number of the UV diodes. In the case when the blue-emitting LEDs are arranged in a planar fashion, it corresponds approximately to the number of the UV diodes (50 to 100%, correspondingly).

A substantial reduction in the number of the blue-emitting LEDs (typically by 10 to 40%) can be achieved when the blue-emitting LEDs are arranged in rows at the edge of the surface fitted with the UV-LEDs. They are then launched into the forward emission of the surface by means of suitable techniques known per se. In the simplest case, a single row is arranged laterally at an edge strip next to an array of UV diodes. It is typical in this case for the launching to be achieved by means of a wedge-shaped (or else flat) plate which has punctiform etchings of different density such that a uniform brightness of the surface is achieved overall.

However, this technique can be modified to the effect that a plurality of edge strips with LEDs arranged in rows are fitted. In the simplest case, therefore, two rows are arranged laterally next to edges of a surface of UV diodes. Proceeding from a rectangular surface, the two rows can be at a right angle to one another or be arranged parallel to one another at opposite edges.

BRIEF DESCRIPTION OF THE DRAWINGS

The invention is to be explained in more detail below with the aid of a plurality of exemplary embodiments. In the drawing.

BEST MODE FOR CARRYING OUT THE INVENTION

Figure 1:
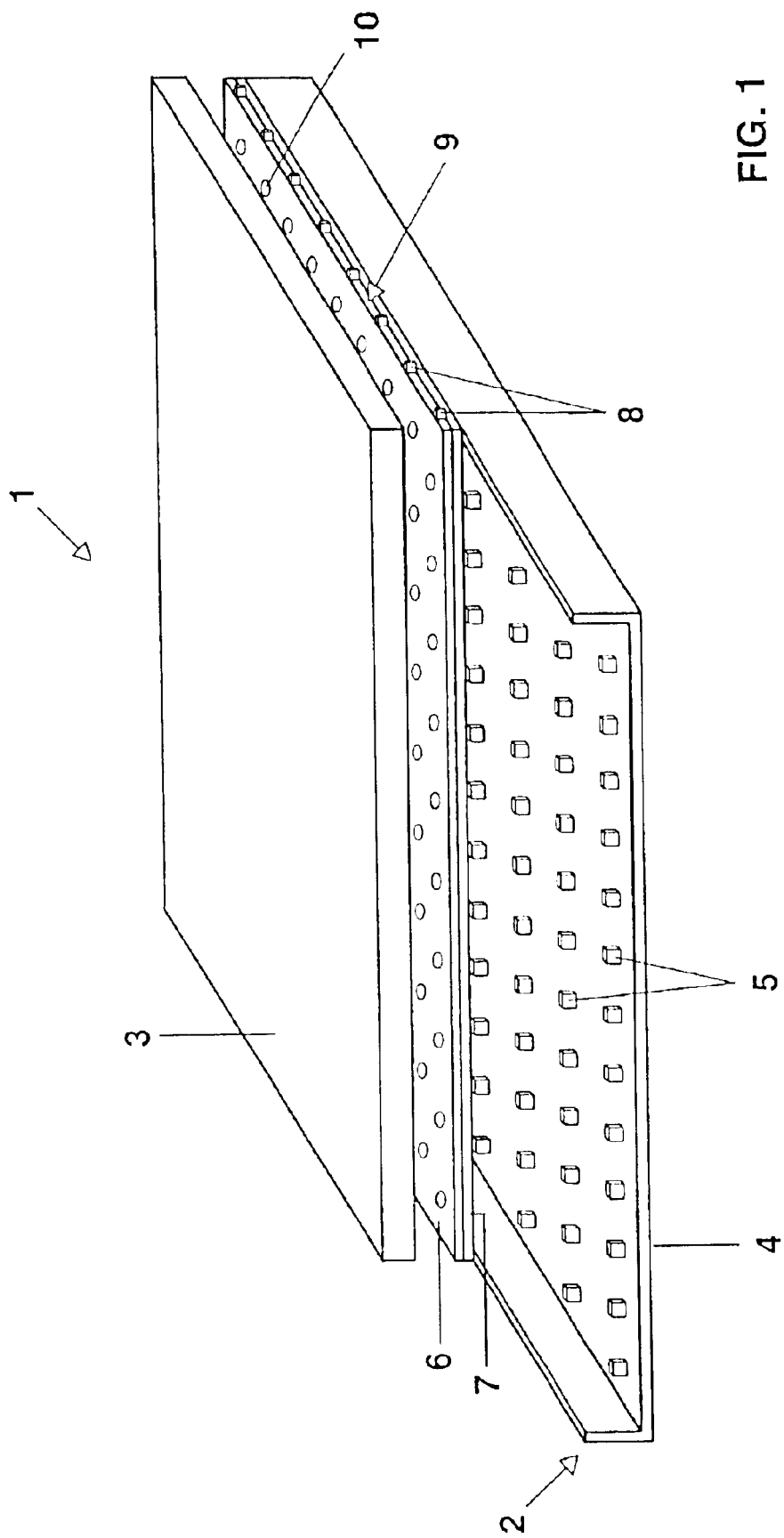
FIG. 1 shows a planar light source, in section.

FIG. 1 shows an LCD display device 1 with a planar light source 2 for backlighting an LCD display 3. An additionally present rectangular housing has been omitted for the sake of simplicity, as is true of customary additional components such as polarization and colour filters and drive units (for example TFTs). The planar light source 2 comprises a basic body 4 on which an array of UV diodes 5 are arranged spaced apart uniformly in the shape of a raster. An optical conductor plate 6, which can be wedge-shaped (no wedge shape is shown), is spaced apart in front of the basic body 4 and mounted parallel thereto. The plate 6 has output means for the uniform upward emission of laterally irradiated light. In the case of a wedge-shaped plate, these coupling centres can be distributed uniformly on the surface of the plate. In the case of a plane-parallel plate, the arrangement of the centres is nonuniform, since only so is it possible for the blue light to be emitted in a fashion distributed uniformly over the surface of the plate. On the side facing the UV-LEDs, the plate 6 is provided with a coating 7 which comprises a mixture of two phosphors with green and red emission. The UV radiation of the diodes 5 (InGaN with 390 nm peak emission wavelength) is converted here virtually completely into red and green light.

Fitted laterally at an edge of the transparent plate 6 (made from glass, plastic, PET or the like) is a row of blue-emitting LEDs 8 whose light is emitted into the plate 6 and is output forwards by the coupling centres 10 on the surface of the plate 6 (for example etchings on the front side of the plate or microprisms, or the like). The blue light mixes with the green and red light from the coating 7 to form white.

The two types of LEDs 5, 8 are driven separately (not illustrated) and can thereby be set to a desired colour location, or else corrected.

Figure 2:
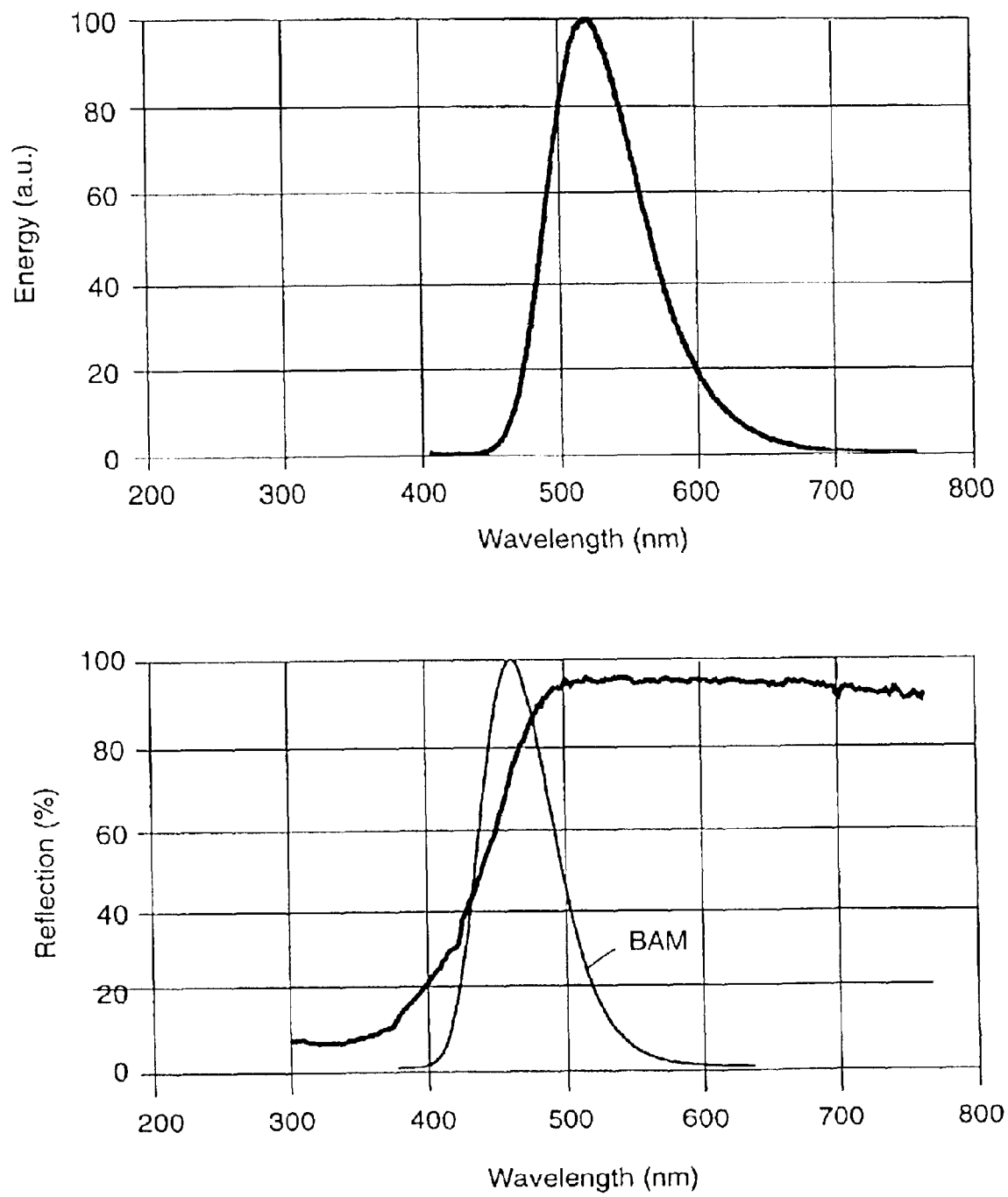
FIG. 2 shows an emission and reflection spectrum of a green-emitting phosphor.

To provide a better understanding of the mode of operation and of the advantages, FIG. 2 shows the emission spectrum and reflection spectrum of an advantageously employed green-emitting phosphor $SrAl_2O_4:Eu^{2+}$ with emission peak wavelength at 524 nm. At the same time, the reflection spectrum also shows the absorption behaviour in accordance with the known relationship $R(\%)=100\%-A(\%)$ where R=reflection and A=absorption. Furthermore, the emission spectrum of a blue-emitting phosphor $(BaMgAl_{19}O_{17}:Eu$, known as BAM) typically used in the prior art is illustrated in the reflection spectrum. It may clearly be seen here that the blue radiation of the BAM would be largely absorbed by the green phosphor. This problem is completely avoided by means of the concept of the present invention.

Figure 3:
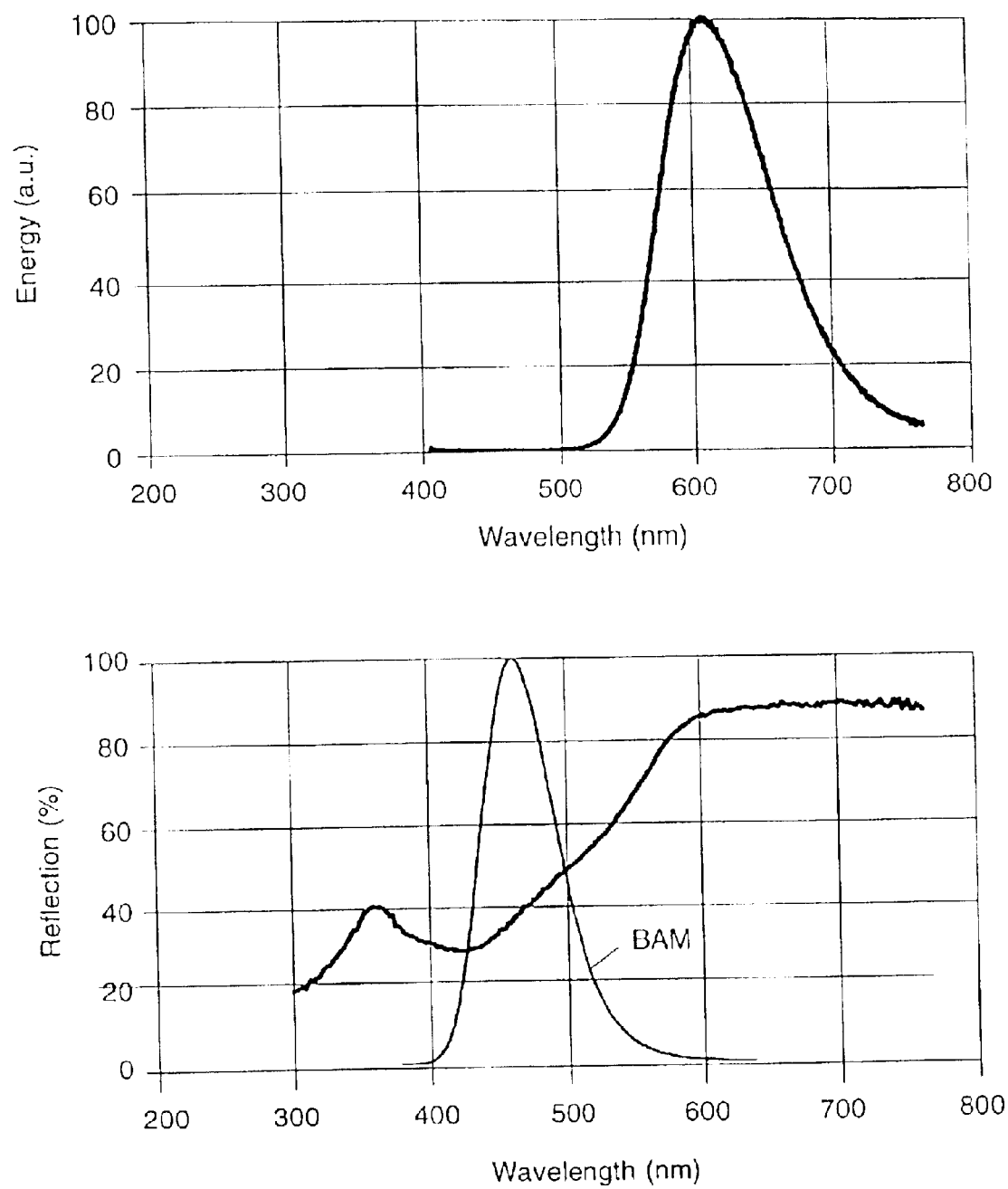
FIG. 3 shows an emission and reflection spectrum of a red-emitting phosphor.

Similarly, FIG. 3 shows the emission spectrum and reflection spectrum of an advantageously employed red-emitting phosphor $Sr_2Si_5NB:Eu^{2+}$ with emission peak wavelength at 623 nm. Here, as well, a blue-emitting phosphor (BAM) typically used in the prior art is illustrated in the reflection spectrum. In this case, as well, a partial absorption of the blue radiation by the red phosphor would be active.

Figure 4:
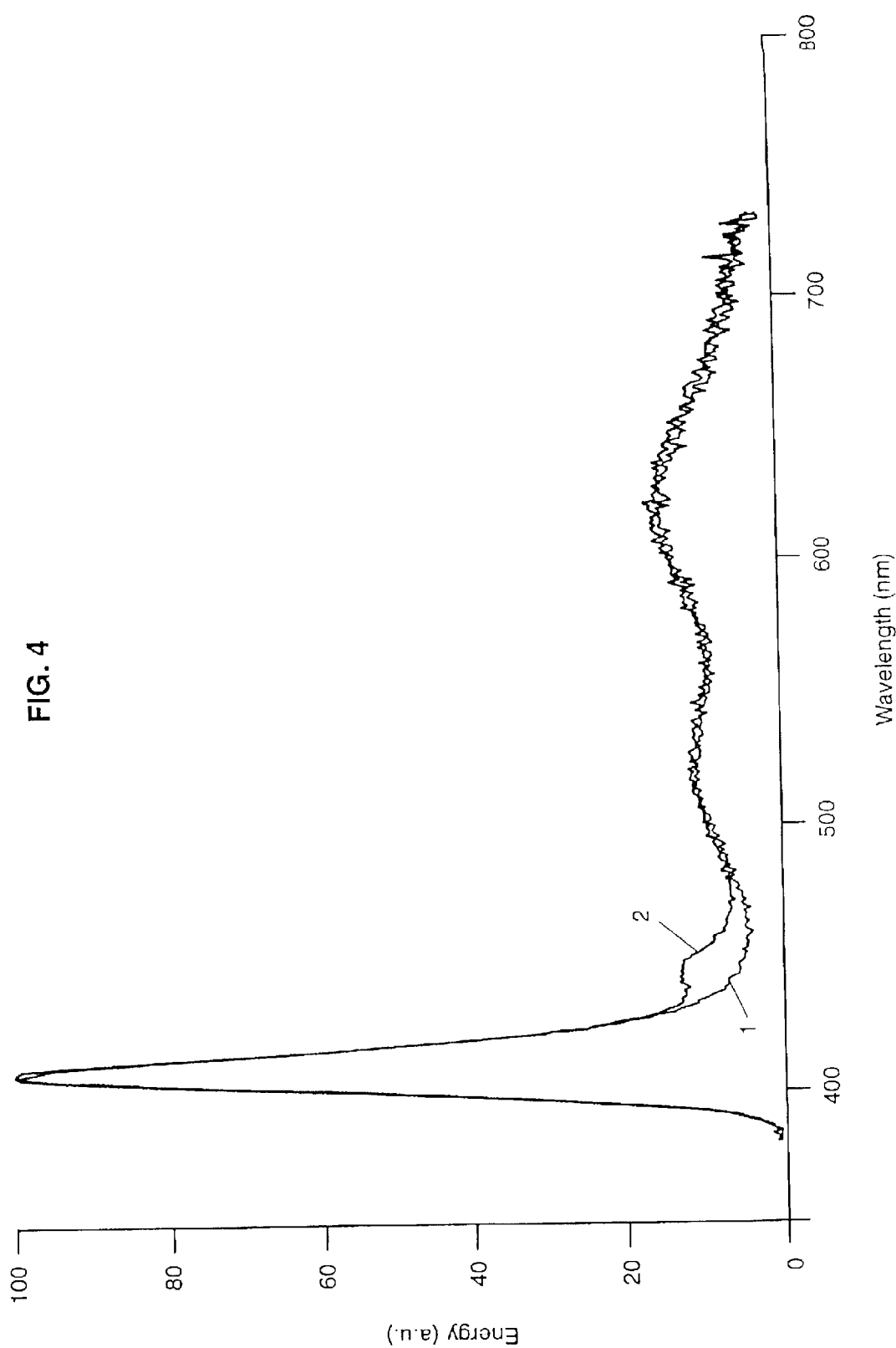
FIG. 4 shows an emission spectrum of a lighting unit according to the invention, compared with a conventional lighting unit.

FIG. 4 shows the emission spectrum of an inventive planar light source with a UV diode array, the conversion of the UV radiation by a previously known phosphor mixture of RGB phosphors as described above being illustrated (1) for the purposes of comparison. According to the invention, a row of blue-emitting LEDs is used (2) instead of the blue phosphor. This arrangement shows a rise in efficiency by 30% (because absorbing mechanisms are eliminated), 10% of the number of the UV-LEDs (originally 50) being dispensed with. Use is made, instead, of a row of blue LEDs (10 items).

Figure 5:
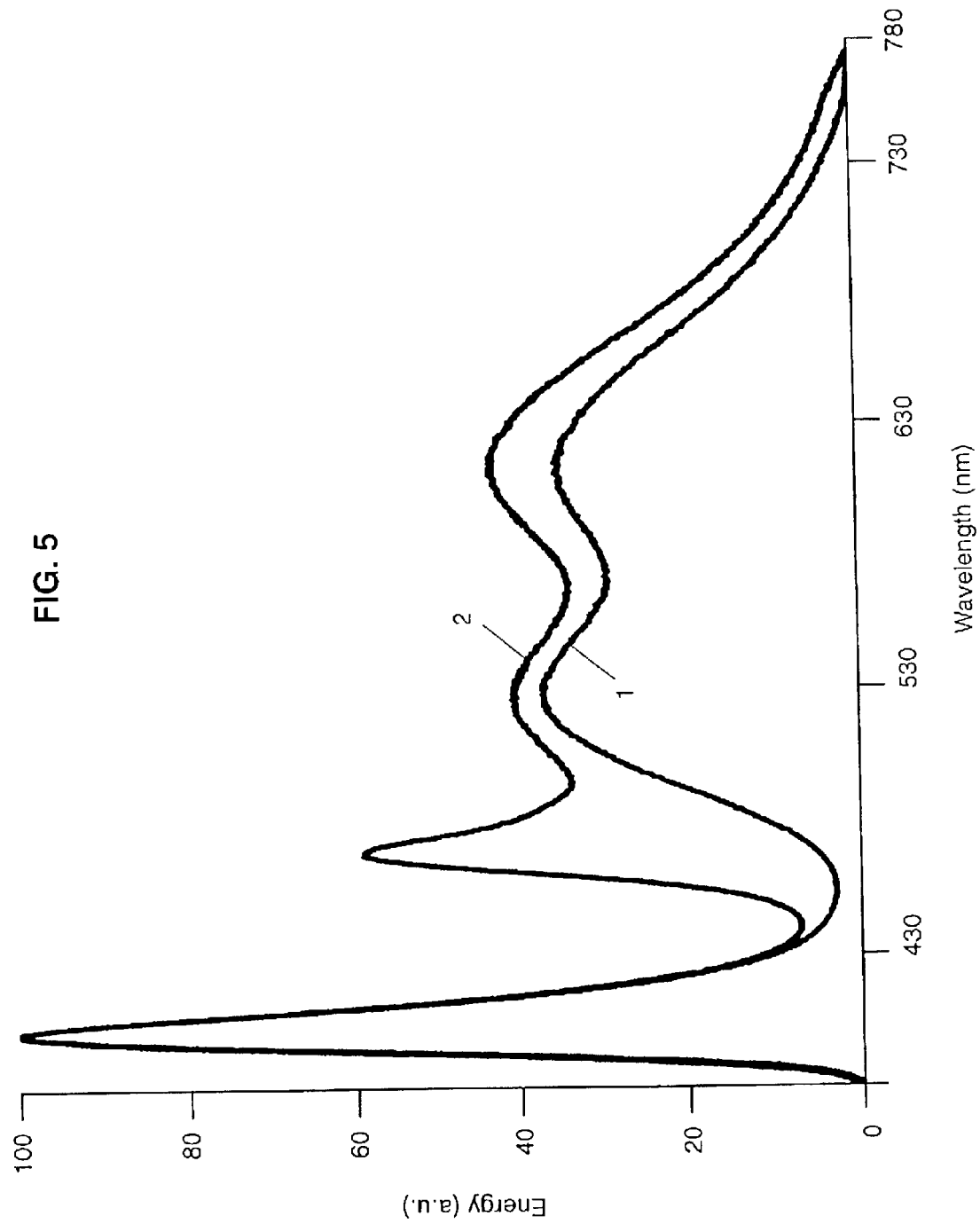
FIG. 5 shows an emission spectrum of a lighting unit according to the invention, with and without a dedicated blue component.

FIG. 5 shows the emission spectrum of an inventive planar light source with a UV diode array (peak wavelength 405 m), the conversion of the UV radiation by a previously known phosphor mixture of RG phosphors as described above being illustrated (1) for the purposes of comparison. According to the invention, a row of blue-emitting LEDs (peak wavelength 460 m) is coupled in (2). This arrangement is set up such that the resulting spectrum is in the vicinity of the white point. For this purpose, the proportion of the blue radiation must be substantially greater compared to the green and red proportions, in order to take account of the sensitivity of the human eye, which is lower in the blue.

A particularly advantageous utilization of the novel mixing principle consists in making an entirely conscious selection as far as possible of a red phosphor and also of a green phosphor which absorbs in each case at least a portion of the blue primary radiation (LED). At least one of the phosphors advantageously absorbs the blue primary radiation as completely as possible. Absorption of the blue radiation is avoided nevertheless owing to the fact that the admixture of the blue radiation in the beam path is performed only after the conversion. A portion of the blue radiation which is deflected in the forward direction is, however, backscattered at the boundary surfaces, consequently traverses the phosphor layer and is converted there at least partially and partially re-emitted in the forward direction. This actually lost portion of the blue radiation is therefore added to the useful radiation, whereas without the possibility of absorption by the red phosphor, and also to a lesser extent by the green phosphor, it could not be used and would, rather, lead to heating up the light source undesirably.

The same concept can also, of course, be implemented in the case of a yellow phosphor.

What is claimed is:

1. LED-based planar light source utilizing the colour mixing principle, the radiation from dot-like UV-emitting diodes, arranged in a planar fashion, being converted into light of longer wavelength by means of conversion by at least one UV-absorbing phosphor, and this light being mixed with a blue component, wherein the radiation of the UV diodes is absorbed by the at least one phosphor while the blue component is provided by at least one blue-emitting LED;

the UV-absorbing phosphors are applied to an optical conductor fitted at a spacing from the UV diodes, or to a transparent plate or are directly located on the individual dot-like UV-LEDs; and the admixture of the blue component provided by the at least one blue-emitting LED is performed only after conversion of the UV-radiation.

2. Planar light source according to claim 1, wherein the radiation of the UV diodes is absorbed by red- and green-emitting phosphors in order to provide a white-emitting light source by utilizing the RGB principle.

3. Planar light source according to claim 1, wherein the radiation of the UV diodes is absorbed by a yellow-emitting phosphor in order to provide a white-emitting light source by utilizing the blue-yellow mixing principle.

4. Planar light source according to claim 1, wherein the radiation of the UV diodes is absorbed by one or a plurality of colour-emitting phosphors in order to provide a colour-emitting light source by utilizing the colour mixing principle.

5. Planar light source according to claim 1, wherein the UV-absorbing phosphors are applied to an optical conductor fitted at a spacing from the UV diodes, or to a transparent plate.

6. Planar light source according to claim 1, characterized in that the number of the blue-emitting LEDs is at most equal to the number of the UV diodes.

7. Planar light source according to claim 1, wherein the blue-emitting LEDs are arranged in a planar fashion.

8. Planar light source according to claim 1, wherein the blue-emitting LEDs are arranged in rows.

9. Planar light source according to claim 8, wherein a row of blue-emitting LEDs is arranged next to an array of UV diodes.

10. Planar light source according to claim 8, wherein at least two rows of blue-emitting LEDs are arranged next to edges of a surface of UV diodes.

11. Planar light source according to claim 1, wherein an GaN-based LED on a silicon carbide substrate is used as UV diode.

12. Planar light source according to claim 1, wherein the peak wavelength of the primary UV emission is at 300 to 420 nm, and the peak wavelength of the blue emission is at 430 to 490 nm, and the secondary emission of green and red phosphors has a peak wavelength of 510 to 560 or 590 to 680 nm.

13. Planar light source according to claim 1, wherein the absorption spectrum at least of the red phosphor overlaps at least partially with the emission spectrum of the blue LEDs.

* * * * *